United States Patent [19]
Chen et al.

[11] Patent Number: 5,828,598
[45] Date of Patent: Oct. 27, 1998

[54] MRAM WITH HIGH GMR RATIO

[75] Inventors: Eugene Chen, Gilbert; Saied N. Tehrani, Tempe; David W. Cronk, Chandler, all of Ariz.

[73] Assignee: Motorola, Inc., Schaumburg, Ill.

[21] Appl. No.: 862,738

[22] Filed: May 23, 1997

[51] Int. Cl.[6] ............................................. G11C 7/00
[52] U.S. Cl. ................................ 365/158; 365/173
[58] Field of Search ................................ 365/158, 171, 365/173, 170

[56] References Cited

U.S. PATENT DOCUMENTS 5,477,482  12/1995  Prinz ............................... 365/173
5,650,958  7/1997  Gallagher et al. ................ 365/171

Primary Examiner—Vu A. Le
Attorney, Agent, or Firm—Eugene A. Parsons

[57] ABSTRACT

A magnetic memory cell with increased GMR ratio includes first and second layers of magnetic material stacked in parallel, overlying relationship and separated by a layer of non-magnetic material sandwiched between the first and second layers of magnetic material. Each of the first and second layers is switchable between a first and a second magnetic state and is formed to switch states with the application of a substantially equal magnetic field. A third layer of magnetic material is positioned adjacent one of the first and second layers of magnetic material so as to alter the amount of magnetic field required to switch the states of the one of the first and second layers of magnetic material. The third layer of magnetic material can be formed with a width larger than the cell width to increase the magnetic width of the cell and reduce the magnetic field required to switch states.

24 Claims, 2 Drawing Sheets

MRAM WITH HIGH GMR RATIO

FIELD OF THE INVENTION

The present invention pertains to magnetic memory cells and more specifically to magnetic memory cells utilizing a giant magnetoresistive (GMR) ratio to sense the states.

BACKGROUND OF THE INVENTION

In the past, a variety of magnetic materials and structures have been utilized to form magnetoresistive materials for non-volatile memory elements, read/write heads for disk drives, and other magnetic type applications. One prior magnetoresistive element utilized a magnetoresistive material that has two magnetic layers separated by a conductor layer. The magnetization vectors of the two magnetic layers typically are anti-parallel to each other in the absence of any magnetic fields. The magnetization vectors of one of the layers points in one direction and the magnetization vector of the other layer always points in the opposite direction. The magnetic characteristics of such magnetic materials typically require a width greater than one micron in order to maintain the orientation of the magnetization vectors along the width of the cell. The large width requirement limits the density of memories utilizing such materials.

Another type of memory cell uses multi-layer giant magnetoresistive materials (GMR) and utilizes dimensions around one micron, in order to increase density. A conductive layer is again disposed between the multi-layers of magnetic material. In this structure the magnetization vectors are parallel to the length of the magnetic material instead of the width. In one embodiment the magnetization vector of one magnetic layer is always maintained in one direction while the magnetization vector of the second magnetic layer switches between parallel and antiparallel to the first vector in order to represent both logical "0" and "1" states. This structure is commonly referred to as a spin valve structure. In another embodiment the magnetization vectors of both magnetic layers are always maintained in the same direction, with opposite vector directions representing logical "0" and "1" states.

Still another type of memory cell uses multi-layer giant magnetoresistive materials (GMR) and also utilizes dimensions around one micron, in order to increase density. In this type of cell a non-conductive layer is disposed between the multi-layers of magnetic material. The magnetization vectors are again parallel to the length of the magnetic material instead of the width but sense current tunnels through the non-conducting layer from one layer of magnetic material to the other, rather than being conducted lengthwise. This structure is commonly referred to as a tunneling GMR cell.

A magnetic random access memory (MRAM) is a non-volatile memory which basically includes a GMR cell, a sense line, and a word line. The MRAM employs the GMR effect to store memory states. Magnetic vectors in one or all of the layers of GMR material are switched very quickly from one direction to an opposite direction when a magnetic field is applied to the GMR cell over a certain threshold. According to the direction of the magnetic vectors in the GMR cell, states are stored, and the GMR cell maintains these states even without a magnetic field being applied. The states stored in the GMR cell can be read by passing a sense current through the cell in a sense line and sensing the difference between the resistances (GMR ratio) when one or both of the magnetic vectors switch. The problem is that in most GMR cells the GMR ratio is relatively low (e.g. 10% or less) and, consequently, reading or sensing the state stored in the GMR cell can be relatively difficult. Some attempts have been made to increase the GMR ratio but most of these attempts result in an increase in the amount of current, or magnetic field, required to switch states. This increase in current, or magnetic field, can result in a substantial operating power increase, especially in large arrays of GMR cells.

Accordingly, it is highly desirable to provide magnetic random access memories and memory cells with increased GMR ratios and without increasing the magnetic field required for writing and reading.

It is a purpose of the present invention to provide a new and improved magnetic memory cell with increased GMR ratio.

It is another purpose of the present invention to provide a new and improved magnetic memory cell including an increased GMR ratio while reducing the amount of magnetic field required for switching states.

It is a purpose of the present invention to provide a new and improved magnetic memory cell with increased GMR ratio with faster speed and low power consumption.

SUMMARY OF THE INVENTION

The above problems and others are at least partially solved and the above purposes and others are realized in a magnetic memory cell with increased GMR ratio including first and second layers of magnetic material stacked in parallel, overlying relationship and separated by a layer of non-magnetic material sandwiched between the first and second layers of magnetic material. Each of the first and second layers of magnetic material is switchable between a first and a second magnetic state and is formed to switch states with the application of a substantially equal magnetic field. A layer of insulating magnetic material is positioned adjacent to one of the first and second layers of magnetic material so as to alter the amount of magnetic field required to switch the states of the one of the first and second layers of magnetic material. The layer of insulating magnetic material can be formed with a width larger than the cell width to increase the magnetic width of the cell and reduce the magnetic field required to switch states.

BRIEF DESCRIPTION OF THE DRAWINGS

Referring to the drawings.

DESCRIPTION OF THE PREFERRED EMBODIMENTS

Figure 1:
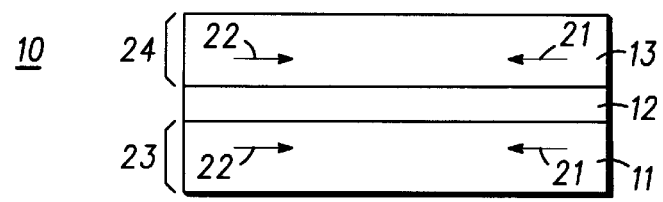
FIG. 1 is a simplified side view of a multi-layer magnetic memory cell utilized for purposes of explanation.

Turning now to the drawings, FIG. 1, which is provided for purposes of explanation, illustrates an enlarged, simplified side view of a magnetic memory cell 10 having multiple layers that are ferromagnetically coupled. Cell 10 includes a first magnetic layer 11 and a second magnetic layer 13, which are separated by a first insulating spacer layer 12.

Figure 2:
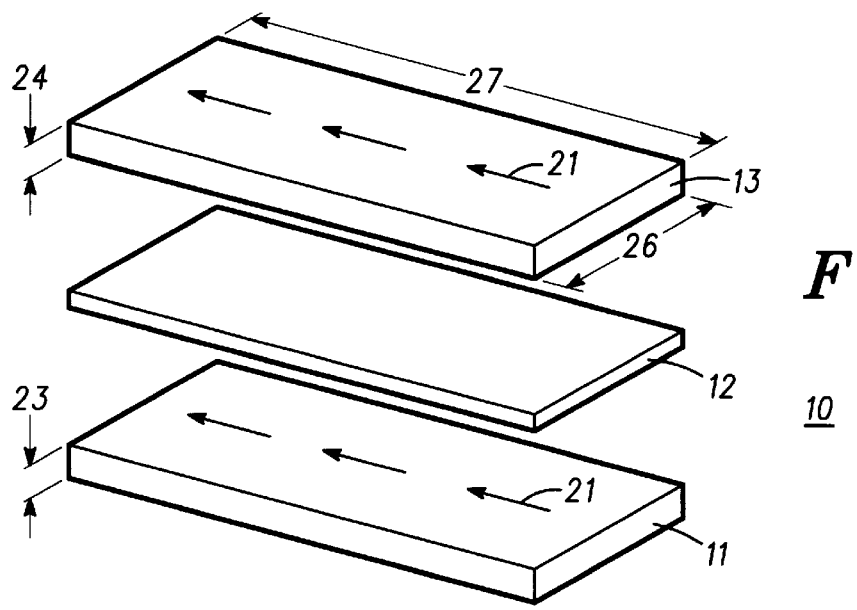
FIG. 2 is a simplified exploded view of the multi-layer magnetic memory cell illustrated in FIG. 1.

Referring to FIG. 2, an enlarged exploded view of cell 10 is illustrated. Portions of FIG. 2 that have the same reference numbers as FIG. 1 are the same as the corresponding FIG. 1 elements. In this example, layers 11 and 13 are rectangular and are formed with the easy axis of magnetization along a length 27 and not along a width 26. Layers 11 and 13 each have magnetization vectors 21 that are positioned substantially along length 27, that is, substantially parallel to length 27. To achieve this orientation, width 26 is formed to be smaller than the width of the magnetic domain walls or transition width within layers 11 and 13. Consequently, vectors 21 cannot be parallel to width 26 in an at rest state.

As illustrated in FIG. 1, vectors 21 and 22 in layers 11 and 13 represent two different states of magnetization within cell 10. It should be understood that these are the same vectors and that they are given different numbers only to indicate different states. One state is referred to as a logic "1" and the other state is a logic "0". While it will be understood by those skilled in the art that any logic definition can be assigned to either state, in this example when vectors 21 of layers 11 and 13 both point to the left in FIG. 1, cell 10 is in a logic "1" state and when vectors 22 in both layers 11 and 13 are in the opposite direction cell 10 is in a logic "0" state. Also, because layers 11 and 13 are ferromagnetically coupled, in this example, the magnetic vectors of layers 11 and 13 are always pointing in the same direction (parallel) when no (or a very small) magnetic field is applied to cell 10. The magnetic vectors are only pointing in opposite directions (antiparallel) when specific magnetic fields are applied to cell 10, as will be explained in more detail presently.

In this specific example, cell 10 is designed with layer 13 thinner than layer 11 so that a smaller magnetic field will switch the magnetization vectors of layer 13 than is required to switch the magnetization vectors of layer 11. Another way to accomplish this design is to form layer 11 out of magnetic material that requires a higher magnetic field to switch the magnetization vectors.

In this example, layer 12 is an electrically insulating nonmagnetic layer which is positioned between ferromagnetic layers 11 and 13 to produce a tunneling junction that allows a flow of current perpendicularly through layer 12, from layer 11 to layer 13 (or vice versa). In a different example, layer 12 can be an electrically conducting nonmagnetic layer positioned between ferromagnetic layers 11 and 13 to produce an in-line type of cell that allows a flow of current along the length thereof. In either example, cell 10 appears as a relatively high impedance (referred herein to as a resistance R), generally several hundred to several thousand ohms, e.g. 100 ohms to 5 kohms. When the magnetization vectors in layers 11 and 13 are antiparallel the resistance R of cell 10 remains very high. When the magnetization vectors in layers 11 and 13 are parallel, the resistance R of cell 10 drops perceptibly. The percentage difference between the resistances is known as the GMR ratio.

Figure 3:
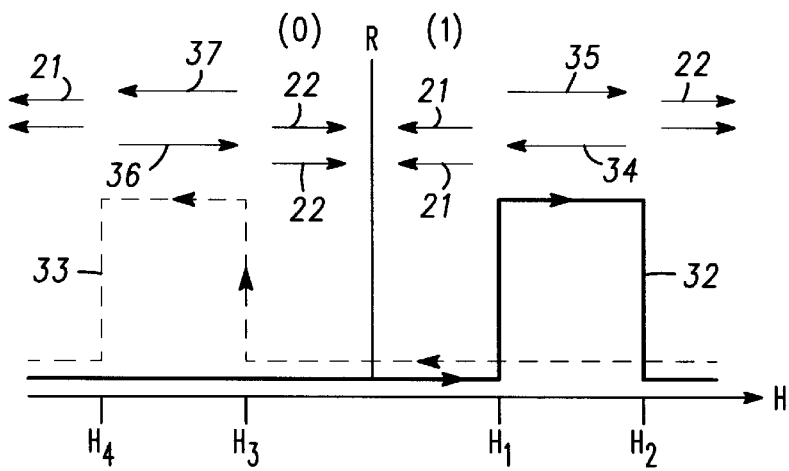
FIG. 3 is a graph illustrating characteristics of the cell of FIG. 1.

Referring specifically to FIG. 3, a graph is illustrated showing the resistance of cell 10 versus different directions of orientation for the magnetic vectors in layers 11 and 13. Also, the direction and strength of an applied magnetic field, required to achieve the various vector directions is shown. The abscissa of the graph indicates magnetic field direction and strength and the ordinate represents the resistance of cell 10. Further, a first curve 32 indicates the cell resistance which can be achieved for the application of various strengths of a magnetic field in a first direction and curve 33 indicates the cell resistance which can be achieved for the application of various strengths of a magnetic field in a second direction. Vectors 34 and 35 are illustrated with curve 32 and represent the magnetic vectors in layers 11 and 13, respectively, for the application of a magnetic field between values $H_1$ and $H_2$ in the positive direction along the abscissa. Similarly, vectors 36 and 37 are illustrated with curve 33 and represent the magnetic vectors in layers 11 and 13, respectively, for the application of a magnetic field between values $H_3$ and $H_4$ in the negative direction along the abscissa.

Assuming cell 10 is in the state in which vectors 21 both point to the left, moving to the right along the abscissa, the magnetic field increases up to a value $H_1$. Before the value $H_1$ is reached, magnetic vectors 21 are oriented in the same direction, designated a logic "1", and the resistance of cell 10 is low. Upon applying sufficient magnetic field to cell 10, herein designated by the value $H_1$, vector 35 switches to an opposite direction (as shown) and the resistance of cell 10 increases perceptibly. As the magnetic field is increased beyond a value $H_2$ vector 34 also switches to an opposite direction and the resistance of cell 10 again drops to a low value with the magnetic vectors now being represented by vectors 22. Similarly, if the magnetic field is applied in the opposite direction curve 33 applies and magnetic vector 37 of layer 13 switches at a value $H_3$ and the magnetic vector 36 of layer 11 switches at a value $H_4$, with the magnetic vectors now being represented by vectors 21. It should be noted that once the vectors of layers 11 and 13 are set in the orientation depicted by vectors 21 or 22 they will remain in that orientation, even after the applied magnetic field is removed, until a magnetic field sufficiently strong to switch them is applied.

Further, the distance or field strength (operating range) between, $H_1$ and $H_2$, or $H_3$ and $H_4$, is determined by the materials used in cell 10 and the various dimensions of the layers. Generally, cell 10 is designed to provide a wide operating range. Thus, in this example and assuming that the magnetization vectors of layer 11 are set in the orientation indicated by curve 32 (vector 34) the cell can be set to a logic "0"(parallel magnetization vectors pointing right in FIG. 3) by applying a field with a strength greater than $H_2$. Also, the cell can be set to a logic "1"(parallel magnetization vectors pointing left in FIG. 3) by applying a magnetic field greater than $H_4$.

The following procedure can be used to read stored states in magnetic memory cell 10. Assuming that the vectors of layers 11 and 13 are set in the orientation indicated by curve 33 (vectors 22), applying a positive magnetic field to cell 10 (either $H_1$ or $H_2$) has no effect, which is an indication that the cell has a logic "0" stored therein. Conversely, applying a negative magnetic field to cell 10 between the values $H_4$ and $H_3$, will cause the magnetic vector in layer 13 to switch (vectors 36 and 37) to an antiparallel position and the substantial change in resistance of the cell can be detected as described above. In a similar fashion, when vectors of layers 11 and 13 are set in the orientation indicated by curve 32 (vectors 21), applying a negative magnetic field to cell 10 (either $H_3$ or $H_4$) has no effect indicating that the cell has a logic "1" stored therein. Conversely, applying a positive magnetic field to cell 10 between the values $H_1$ and $H_2$, will cause the magnetic vector in layer 13 to switch (vectors 34 and 35) to an antiparallel position and the substantial change in resistance of the cell is easily detected.

Thus, it can be seen that different magnetic fields are required to switch states in magnetic layers 11 and 13, i.e. layer 13 switches states at $H_1$ or $H_3$ and layer 11 switches states at $H_2$ or $H_4$. The different magnetic characteristics of layers 11 and 13 provides the memory function in cell 10 which allows reading and writing the different states. However, a problem arises in the above example because the GMR ratio in a cell with two layers of different thicknesses is about 40% lower than a cell with two layers of the same thickness. Further, as the number of cells in an MRAM array is increased, the width of each individual memory cell is decreased and the magnetic switching field required to switch states in a memory cell increases substantially linearly with the inverse of the cell width. Thus, as MRAM arrays increase in cell density, higher magnetic switching fields are required, requiring higher word current to read and write the cells, causing higher power consumption.

Figure 4:
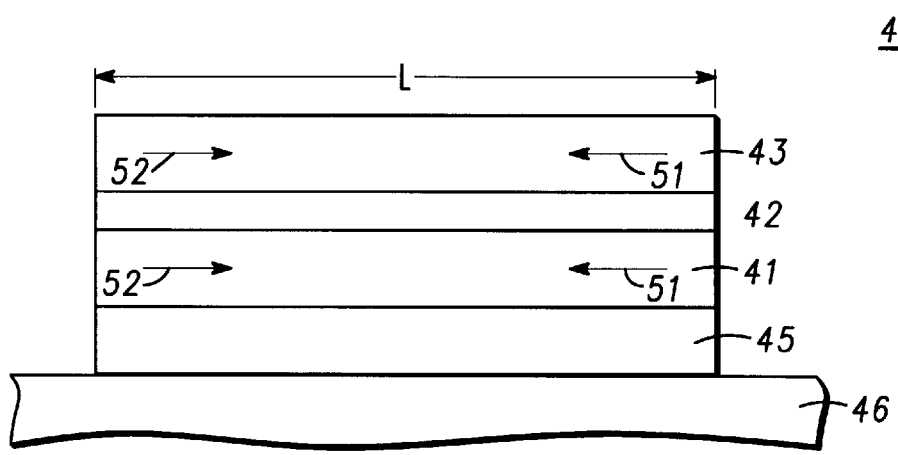
FIG. 4 is a simplified side view of a magnetic memory cell with increased GMR ratio in accordance with the present invention.

Turning to FIG. 4, a simplified side view of a magnetic memory cell 40 with increased GMR ratio in accordance with the present invention is illustrated. Magnetic memory cell 40 includes a first layer 41 of magnetic material and a second layer 43 of magnetic material, which are separated by a first conducting spacer layer 42. Each magnetic layer 41 and 43 is constructed as described above so as to be switchable between a first and a second magnetic state. Further, each magnetic layer 41 and 43 is formed to switch states with the application of a substantially equal magnetic field. In this specific embodiment, magnetic layers 41 and 43 are constructed with substantially equal thicknesses, which results in substantially equal electrical properties and maximizes the GMR ratio.

In this example, layers 41 and 43 are generally rectangular and are formed with the easy axis of magnetization along the length (in the plain of the figure) and not along the width (perpendicular to the figure) of cell 40. Layers 41 and 43 each have magnetization vectors 51 that are positioned substantially along or parallel to the length of cell 40. To achieve this orientation, the width is formed to be smaller than the width of the magnetic domain walls or transition width within layers 41 and 43. Consequently, vectors 51 cannot be parallel to the width. Typically, widths of less than 1.0 to 1.2 microns result in such a constraint. In the preferred embodiment, the width of cell 40 is less than one micron and is as small as can be made by manufacturing technology, and the length is greater than the width.

As illustrated in FIG. 4, vectors 51 and 52 in layers 41 and 43 represent two different states of magnetization within cell 40. It should be understood that these are the same vectors and that they are given different numbers only to indicate different states. One state is referred to as a logic "1" and the other state is a logic "0". While it will be understood by those skilled in the art that any logic definition can be assigned to either state, in this example when vectors 51 of layers 41 and 43 both point to the left in FIG. 4, cell 40 is in a logic "1" state and when vectors 52 in both layers 41 and 43 are in the opposite direction cell 40 is in a logic "0" state. Also, layers 41 and 43 are ferromagnetically coupled, in this embodiment, so that the magnetic vectors of layers 41 and 43 are always pointing in the same direction (parallel) when no (or a very small) magnetic field is applied to cell 40. The magnetic vectors are only pointing in opposite directions (antiparallel) when specific magnetic fields are applied to cell 40, as explained above.

A layer 45 of magnetic material is positioned adjacent magnetic layer 41 so as to alter the amount of magnetic field required to switch the states of magnetic layer 41. In this embodiment layer 45 is formed by depositing magnetic material on the surface of a substrate 46. Layer 41 is then deposited on the surface of layer 45 and layers 42 and 43 are sequentially deposited in overlying relationship. When layer 42 is a conductor, layer 45 may be formed of an insulating magnetic material, such as FeN, or of a highly resistive magnetic material, such as CoZrNb, CoZrTa, etc., both of which are herein generally referred to as insulating magnetic materials. When layer 42 is an insulator, layer 45 may be formed of a conducting magnetic material, such as NiFe, NiFeCo, Co, CoFe, etc.

In operation, an insulating layer 45 cooperates, or is exchange coupled to layer 41 to alter the magnetic properties while retaining the electrical properties constant. The combination of layers 45 and 41 magnetically appears as a layer of magnetic material which is thicker than layer 43 and, consequently, requires a larger magnetic field to switch states. However, the combination of layers 45 and 41 electrically appears as a layer of magnetic material which is the same thickness as layer 43 and, consequently, the GMR ratio is maximized. Thus, the novel combination of magnetic layer 41 and insulating magnetic layer 45 in magnetic memory cell 40 allows the separation of the electrical and magnetic properties of magnetic memory cell 40 with the consequent ability to separately maximize each property.

It should be understood that layer 45 is illustrated as being adjacent layer 41 but a similar operation and function can be achieved by forming layers 41, 42 and 43 directly on supporting substrate 46 and then forming layer 45 on the surface of layer 43. It is also anticipated that the magnetic properties of layer 41, for example, could be favorably altered by placing layer 45 beside layer 41 or in a surrounding or semi-surrounding configuration.

Magnetic layers 41 and 43 each can be single layers of ferromagnetic materials such as a layer of nickel, iron, cobalt, or alloys thereof including alloys having palladium or platinum therein. Alternatively, either of layers 41 and 43 can be a composite ferromagnetic layer, such as a layer of nickel-iron-cobalt covering a layer of cobalt-iron or three layer structures including layers of cobalt-iron and nickel-iron-cobalt and cobalt-iron with cobalt-iron at the interface with adjacent layers. Materials that are suitable for conductive layer 42 include Cu, Ag, Au, etc. When layer 42 is an insulator, the memory cell is a magnetic tunneling junction where current is passed through the memory cell vertically from layer 41 to layer 43. Layer 45 in FIG. 4, will not change electrical properties of the tunnel junction memory cell because the current flows vertically.

In a specific example, layer 41 is formed of cobalt (Co) approximately 40 Å thick, layer 42 is formed of copper (Cu) approximately 20 Å thick, layer 43 is formed of cobalt approximately 40 Å thick, and layer 45 is formed of FeN approximately 40 Å thick. Thus, the state of cell 40 is relatively easily sensed by applying a specific magnetic field to cell 40 and passing a sense current through the memory cell. Any change of resistance in cell 40 is easily read as a change in voltage drop across cell 40 which can conveniently be used in conjunction with memory arrays and the like.

It should be understood by those skilled in the art that the structure of the present invention can be operated with modes other than the ferromagnetic mode of the present embodiment. Two examples are the antiferromagnetic mode and the spin valve mode. In the antiferromagnetic mode, the resting states of the two magnetic layers 41 and 43 are either clock-wise or anti-clock-wise antiparallel orientations of vectors 51 and 52. These two states can be used as logic "1" and logic "0" states. In the spin valve mode, one of the layers 41 and 43 is pinned and the other layer can be switched to be either parallel or antiparallel to the pinned layer. The parallel and antiparallel states of vectors 51 and 52 can be used as logic "1" and logic "0" states.

Figure 5:
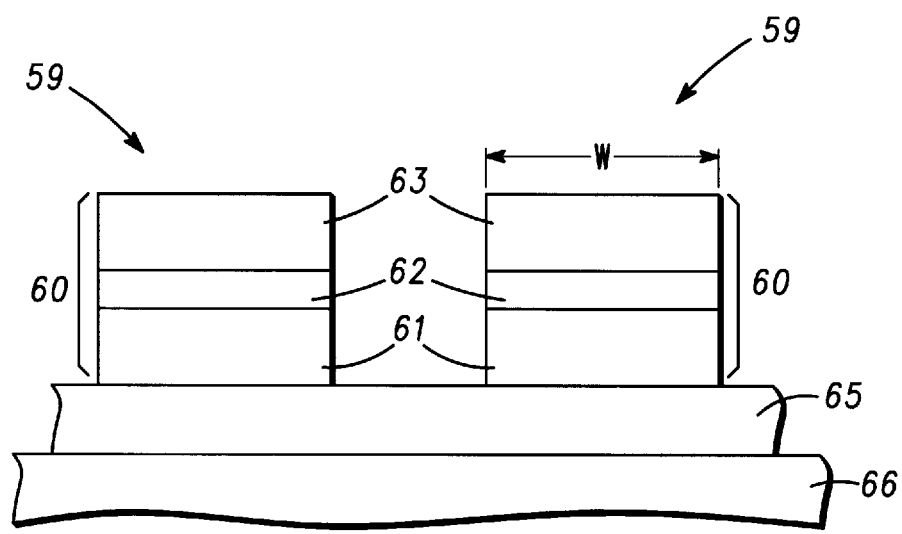
FIG. 5 is a simplified side view of a plurality of magnetic memory cells with increased GMR ratio in accordance with the present invention.

Turning now to FIG. 5, a simplified side view of a plurality of magnetic memory cells 59 with increased GMR ratio in accordance with the present invention is illustrated. Each magnetic memory cell 59 includes a magnetic memory cell structure 60 comprising a layer 61 of magnetic material and a layer 63 of magnetic material stacked in parallel, overlying relationship and separated by a layer 62 of non-magnetic material sandwiched between layers 61 and 63 so as to form a portion of a multi-layer magnetic memory cell structure 60. Each of the layers 61 and 62 is constructed generally as described above so as to be switchable between a first and a second magnetic state, and each of layers 61 and 63 is also formed to switch states with the application of a substantially equal magnetic field, thus maximizing the GMR ratio.

A layer 65 of magnetic material is positioned on a substrate 66 and each magnetic memory cell structure 60 of the plurality of multi-layer magnetic memory cells 59 is positioned on layer 65 in spaced relationship from other magnetic memory cell structures 60 of the plurality of multi-layer magnetic memory cells 59. Layer 65 cooperates (i.e. it is exchange coupled to layer 61) with each magnetic memory cell structure 60 to form a multi-layer magnetic memory cell with the magnetic properties of lower layer 61 altered so that the amount of magnetic field required to switch the states of layer 61 is smaller than the amount of magnetic field required to switch the states of layer 63.

Because layer 65 is shared by each of the plurality of multi-layer magnetic memory cells 59, it is substantially wider than each magnetic memory cell structure 60. In this embodiment layer 65 cooperates with each magnetic memory cell structure 60 to alter the magnetic properties so that each multi-layer magnetic memory cell 59 magnetically appears to be much wider. Since the magnetic switching field required to switch states in a memory cell increases substantially linearly with the inverse of the cell width, the magnetic switching field required to switch states in each multi-layer magnetic memory cell 59 is substantially reduced by the widening effect of layer 65.

It will be understood that in the in-plane GMR MRAM embodiment a wide insulating magnetic layer can be used as described above under a single cell, if desired, or under a larger plurality, or even a complete row of cells in a two dimensional array of cells. In an embodiment in which a wide insulating magnetic layer is used under a complete row of cells in a two dimensional array of cells, for example, a word line (not shown) will normally extend parallel with the row of cells (parallel with the plane of the paper in FIG. 5) and a sense line (not shown) will extend perpendicular to the row (perpendicular to the plane of the paper in FIG. 5). Although all cells on layer 65 will be energized by current in the word line during a read cycle, only the one sense line with sense current flowing will register a read voltage.

Accordingly, new and improved magnetic random access memories and memory cells with increased GMR ratios have been disclosed. Specifically, the electrical properties and the magnetic properties of the cells are separated so that each can be maximized and, thus, the GMR ratio of the memory cells is increased while reducing the amount of magnetic field required for switching states. Because of the increased GMR ratio and reduced magnetic field the new and improved magnetic memory cells operate with faster speed and lower power consumption.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A magnetic memory cell with increased GMR ratio comprising:

first and second layers of magnetic material stacked in parallel, overlying relationship and separated by a layer of non-magnetic material sandwiched between the first and second layers of magnetic material so as to form a multi-layer magnetic memory cell having a length and a width, each of the first and second layers being switchable between a first and a second magnetic state, and each of the first and second layers being formed to switch states with the application of a substantially equal magnetic field;

a third layer of magnetic material positioned adjacent one of the first and second layers of magnetic material so as to alter the amount of magnetic field required to switch the states of the one of the first and second layers of magnetic material.

2. A magnetic memory cell with increased GMR ratio as claimed in claim 1 wherein the first and second layers of magnetic material have a substantially equal thickness.

3. A magnetic memory cell with increased GMR ratio as claimed in claim 1 wherein the width of the multi-layer magnetic memory cell is less than a width of magnetic domain walls within the layers of magnetic material so that magnetic vectors in the layers of magnetic material point substantially along a length of the layers of magnetic material.

4. A magnetic memory cell with increased GMR ratio as claimed in claim 3 wherein the layer of non-magnetic material sandwiched between the first and second layers of magnetic material is an electrically insulating material and the multi-layer magnetic memory cell is a tunneling type cell.

5. A magnetic memory cell with increased GMR ratio as claimed in claim 4 wherein the third layer of magnetic material is an conductor.

6. A magnetic memory cell with increased GMR ratio as claimed in claim 3 wherein the layer of non-magnetic material sandwiched between the first and second layers of magnetic material is an electrically conductive material and the multi-layer magnetic memory cell is an in-plane type cell.

7. A magnetic memory cell with increased GMR ratio as claimed in claim 6 wherein the third layer of magnetic material is an insulator.

8. A magnetic memory cell with increased GMR ratio as claimed in claim 1 wherein the third layer of magnetic material has a width greater than the width of the multilayer magnetic memory cell so as to reduce the amount of magnetic field required to switch the states.

9. A magnetic memory cell with increased GMR ratio as claimed in claim 1 wherein the third layer of magnetic material includes one of CoZrNb, CoZrTa, and FeN.

10. A magnetic memory cell with increased GMR ratio comprising:

first and second layers of magnetic material each being switchable between a first and a second magnetic state, and each of the first and second layers being formed to switch states with the application of a substantially equal magnetic field;

the first and second layers of magnetic material being stacked in parallel, overlying relationship and separated by a layer of non-magnetic material sandwiched between the first and second layers of magnetic material so as to form a multi-layer magnetic memory cell having a length and a width; and a third layer of magnetic material, with the first layer of magnetic material being disposed on the layer of insulating material so as to alter the amount of magnetic field required to switch the states of the first layer of magnetic material.

11. A magnetic memory cell with increased GMR ratio as claimed in claim 10 wherein the first and second layers of magnetic material have a substantially equal thickness.

12. A magnetic memory cell with increased GMR ratio as claimed in claim 10 wherein the width of the multi-layer magnetic memory cell is less than a width of magnetic domain walls within the layers of magnetic material so that magnetic vectors in the layers of magnetic material point substantially along a length of the layers of magnetic material.

13. A magnetic memory cell with increased GMR ratio as claimed in claim 12 wherein the layer of non-magnetic material sandwiched between the first and second layers of magnetic material is an electrically insulating material and the multi-layer magnetic memory cell is a tunneling type cell.

14. A magnetic memory cell with increased GMR ratio as claimed in claim 13 wherein the third layer of magnetic material is an conductor.

15. A magnetic memory cell with increased GMR ratio as claimed in claim 12 wherein the layer of non-magnetic material sandwiched between the first and second layers of magnetic material is an electrically conductive material and the multi-layer magnetic memory cell is an in-plane type cell.

16. A magnetic memory cell with increased GMR ratio as claimed in claim 15 wherein the third layer of magnetic material is an insulator.

17. A magnetic memory cell with increased GMR ratio as claimed in claim 10 wherein the third layer of magnetic material has a width greater than the width of the multi-layer magnetic memory cell so as to increase the magnetic width of the multi-layer magnetic memory cell and reduce the amount of magnetic field required to switch the states.

18. A magnetic memory cell with increased GMR ratio as claimed in claim 10 wherein the third layer of magnetic material includes one of CoZrNb, CoZrTa, and FeN.

19. A plurality of magnetic memory cells with increased GMR ratio comprising:

a plurality of multi-layer magnetic memory cell structures each including first and second layers of magnetic material stacked in parallel, overlying relationship and separated by a layer of non-magnetic material sandwiched between the first and second layers of magnetic material so as to form a portion of a multi-layer magnetic memory cell, each of the first and second layers being switchable between a first and a second magnetic state, and each of the first and second layers being formed to switch states with the application of a substantially equal magnetic field;

a third layer of magnetic material; and each magnetic memory cell structure of the plurality of multi-layer magnetic memory cell structures being positioned on the third layer of magnetic material in spaced relationship from other magnetic memory cell structures of the plurality of multi-layer magnetic memory cell structures so as to alter the amount of magnetic field required to switch the states of one of the first and second layers of magnetic material in each magnetic memory cell structure.

20. A plurality of magnetic memory cells with increased GMR ratio as claimed in claim 19 wherein the first and second layers of magnetic material in each of the plurality of multi-layer magnetic memory cell structures have a substantially equal thickness.

21. A plurality of magnetic memory cells with increased GMR ratio as claimed in claim 19 wherein the width of each of the multi-layer magnetic memory cell structures in the plurality of multi-layer magnetic memory cell structures is less than a width of magnetic domain walls within the layers of magnetic material so that magnetic vectors in the layers of magnetic material point substantially along a length of the layers of magnetic material.

22. A plurality of magnetic memory cells with increased GMR ratio as claimed in claim 21 wherein the layer of non-magnetic material sandwiched between the first and second layers of magnetic material in each of the multi-layer magnetic memory cell structures is an electrically insulating material and each of the multi-layer magnetic memory cell structures forms a tunneling type magnetic memory cell with the third layer of magnetic material being electrically conducting.

23. A plurality of magnetic memory cells with increased GMR ratio as claimed in claim 21 wherein the layer of non-magnetic material sandwiched between the first and second layers of magnetic material in each of the multi-layer magnetic memory cell structures is an electrically conductive material and each of the multi-layer magnetic memory cell structures forms an in-plane type magnetic memory cell with the third layer of magnetic material being electrically insulating.

24. A plurality of magnetic memory cells with increased GMR ratio as claimed in claim 19 wherein the third layer of magnetic material includes one of CoZrNb, CoZrTa, and FeN.

* * * * *